(12) United States Patent
Tanaka et al.

(10) Patent No.: US 6,780,793 B2
(45) Date of Patent: Aug. 24, 2004

(54) PRODUCTION METHOD OF SEMICONDUCTOR DEVICE

(75) Inventors: Yoshiyuki Tanaka, Kanagawa (JP); Yoshiyuki Enomoto, Kanagawa (JP); Masaki Saito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/955,810

(22) Filed: Sep. 19, 2001

(65) Prior Publication Data

US 2002/0127880 A1 Sep. 12, 2002

(30) Foreign Application Priority Data

Sep. 25, 2000 (JP) .................................... P2000-290259

(51) Int. Cl.[7] ............................................ H01L 21/469
(52) U.S. Cl. ....................... 438/787; 438/624; 257/646
(58) Field of Search ..................... 438/624, 778–790; 257/638–646, 752, 766

(56) References Cited

U.S. PATENT DOCUMENTS 6,028,013 A * 2/2000 Annapragada et al. ...... 438/783
6,165,915 A * 12/2000 Jang ............................ 438/787
6,180,540 B1 * 1/2001 Jang ............................ 438/784
6,191,026 B1 * 2/2001 Rana et al. .................. 438/624
6,274,933 B1 * 8/2001 Abdelgadir et al. ......... 257/758
6,410,106 B2 * 6/2002 Tsai et al. .................... 427/579

* cited by examiner

Primary Examiner—Caridad Everhart
Assistant Examiner—Calvin Lee
(74) Attorney, Agent, or Firm—Robert J. Depke; Holland & Knight LLP

(57) ABSTRACT

An improved method for producing a semiconductor device with a fluorine-doped silicon oxide interlayer insulating film. In one embodiment, the fluorine-doped silicon oxide layer (FSG layer) is formed in a process chamber. Thereafter, a silicon oxide layer is formed in the same process chamber over the FSG layer at a higher temperature than the FSG layer formation temperature. In another embodiment, after the FSG layer is formed, a surface layer of the FSG layer is selectively sputtered away before the silicon oxide layer is formed.

3 Claims, 11 Drawing Sheets

PRODUCTION METHOD OF SEMICONDUCTOR DEVICE

CROSS REFERENCE TO RELATED APPLICATION

This application claims priority to Japanese Patent Application No. JP 2000-290259, and the disclosure of that application is incorporated herein by reference to the extent permitted by law.

BACKGROUND OF THE INVENTION

1. Field of the Invention

The present invention relates to a method for producing a semiconductor device, particularly to a method for producing a semiconductor device utilizing an interlayer insulating film of fluorine doped silicon oxide having a low dielectric constant.

2. Description of the Related Art

Recently, miniaturization and utilization of multilevel interconnection in a device structure are advanced further to respond to the rising needs for higher order of integration and multifunction in a semiconductor device. Such advancement of the semiconductor device is causing serious problems such as signal delay or larger power consumption due to an increase of wiring capacity. To countermeasure the problems, a dual damascene wiring forming technology is introduced. The dual damascene wiring forming technology enables to use copper (Cu) of a low resistance material for wiring material. However, the technology has an shortcoming. That is, an additional investment for building new infrastructure is required to carry out the dual damascene wiring forming technology, and a manufacturing cost may be increased.

Alternatively, the following method shown in FIG. 6 is suggested. In the method, a low dielectric constant material is utilized as an interlayer insulating film 3 to fill gaps between wiring 2 formed on a substrate 1. Fluorine-containing silicon oxide (so called fluorinated silicate glass (FSG)) or polyimide-series organic resin may be considered as a candidate for the low dielectric constant insulation film material. Particularly, the FSG layer is a promising material to realize lower cost production because that (1) the FSG layer can be formed by utilizing a widely-used plasma chemical vapor deposition (CVD) apparatus for forming silicon oxide film and (2) the FSG layer is comparably easy to switch with a silicon oxide film in a process for forming interlayer insulating film.

However, quality of the FSG layer deteriorates due to moisture absorption as fluorine concentration increases so as to lower the dielectric constant thereby a metal wiring film formed at the upper part are tend to be flaked off. As a way to prevent such things happen, Japanese Patent Publication No. JP 07-29975, JP 07-74245 disclose a method to prevent the moisture absorption of the FSG layer by forming a layer of a silicon oxide film on the FSG layer.

The FSG layer is formed at a low temperature equal or less than 500° C. while being heated with plasma-assisted heating. Accordingly, undesirable impurities such as hydrogen and defects such as unstable Si—Fx bonding (called free species hereafter), that are generated in plasma during the film forming process, may tend to be incorporated into the film. It is known that the free species incorporated in the film desorbs during a formation process of the metal wiring film thereby causing flaking-off of the metal wiring film. Accordingly, it is desired to desorb the free species in the film by applying heat equal or more than the film forming temperature after the FSG layer formation.

When the interlayer insulating film covering the wiring is planarized as shown in FIG. 7, the following steps are performed. First, FSG film 3 is formed on the substrate 1 so as to cover wiring 2. Then, an insulation film 4 having superior planar property is formed on the FSG film 3. Finally, a chemical mechanical polishing (CMP) is performed on the insulation film 4. However, a structure of the film may change to cause, for example, desorption of fluorine from the FSG film 3 due to an reaction with the polishing slurry if the CMP advances to reach the FSG film 3 thereby causing deterioration of the film quality at exposed surface layer of the FSG film 3.

FIGS. 8–10 show graphs comparing changes in the film quality of the FSG layer before the CMP (as-deposited) and after the CMP. Here, the CMP is performed on the FSG layer with using polishing conditions for a typical silicon oxide wherein the FSG layer is formed by a parallel plate plasma CVD apparatus utilizing film forming gas of tetraethoxy silane (TEOS)/oxygen($O_2$)/ethan hexafluoride($C_2F_6$). Si—F bond content at the vertical axis shown FIG. 8 indicates an area ratio of Si—F bond peak with respect to Si—O bond peak obtained by a FT-IR/ATR method. —OH bond content at the vertical axis shown FIG. 9 indicates an area ratio of —OH bond peak with respect to Si—O bond peak obtained by a FT-IR/ATR method.

As shown in FIG. 8, the Si—F bond content in the FSG layer is decreased after the CMP process. Further, as shown in FIG. 9, a bond content with hydroxyl group in the FSG layer is increased after the CMP process. Further, as shown in FIG. 10, both a refractive index and a relative dielectric constant of the FSG layer are increased after the CMP It is contemplated that these observed changes (deterioration) are caused by hydrolysis of the Si—F bond due to moisture absorption of the FSG layer during the CMP process.

In order to prevent fluorine diffusion due to the deterioration of the FSG layer quality described above, JP application (Published) 10-26829 discloses a method for forming a silicon oxide film 6 as a cap layer on a polished surface generated by the CMP process thereby preventing the flaking-off of wiring formed on the FSG film 3 as shown in FIG. 11. However, there is possibility of losing the low dielectric constant effect in the FSG film 3 as described above in case that a part A having deteriorated film quality due to the CMP process extends down into the inside of the FSG layer. Accordingly, there is suggested another method for forming the cap layer of the silicon oxide film 6 after removing the deteriorated part A by sputtering after the CMP process.

SUMMARY OF THE INVENTION

However, in the methods of forming the silicon oxide film and adding the heating process after the FSG layer forming process to prevent the film flaking-off at the interlayer insulating film comprising the FSG among the above-cited production methods, the substrate is required to transfer between a film forming chamber of the FSG layer and a film forming chamber of the silicon oxide film, or, between a film forming chamber of the FSG layer and a heat processing chamber. These additional process may causes an increase of the production steps for the semiconductor device.

Further, the method utilizing the sputtering of the polished surface layer or the method for forming the silicon oxide layer on the polished surface after the CMP process may also cause an increase of production steps for the semiconductor device.

Accordingly, it is desired to provide a semiconductor device production method capable of forming a FSG layer with a better film quality without significantly increasing a number of process steps.

A semiconductor device production method in accordance with one embodiment of the present invention is a semiconductor device production method including a step for forming an interlayer insulating film having a fluorine-doped silicon oxide layer on a substrate. In a first method according to one embodiment of the present invention, a silicon oxide layer is formed after formation of a fluorine-doped silicone oxide layer in the same chamber of a plasma processing apparatus. The silicon oxide layer is formed on the fluorine-doped silicon oxide layer at temperature higher than a forming temperature of the fluorine-doped silicon oxide layer. The interlayer insulating film comprises these fluorine-doped silicon oxide layer and silicon oxide layer formed thereon.

According to the first method, the free species incorporated into the fluorine-doped silicon oxide layer during its formation may be desorbed from the fluorine-doped silicon oxide layer during the subsequent formation of the silicon oxide layer with a higher temperature than the forming temperature of the fluorine-doped silicon oxide layer. Furthermore, the formations of the fluorine-doped silicon oxide layer and the silicon oxide layer are performed continuously in the same chamber. Accordingly, it is not necessary to increase a number of the process steps as long as forming conditions of each films are modified accordingly.

In a second method according to one embodiment of the present invention, a surface layer of a fluorine-doped silicon oxide layer is removed by sputtering. The sputtering of the surface layer is subsequently performed after formation of the fluorine-doped silicon oxide layer. Both the formation of the fluorine-doped silicon oxide layer and the sputtering may be carried out in the same chamber of a plasma processing apparatus.

According to the second method, a low temperature annealing effect due to plasma energy may act on the fluorine-doped silicon oxide layer by sputtering the surface layer of the fluorine-doped silicon oxide layer. Accordingly, the free species incorporated into the fluorine-doped silicon oxide layer during its formation may be desorbed from the fluorine-doped silicon oxide layer during the sputtering process. Furthermore, it is not necessary to increase a number of the process steps as long as source gases and processing conditions are modified accordingly since the formation of the fluorine-doped silicon oxide layer and the sputtering are continuously carried out in the same chamber.

BRIEF DESCRIPTION OF THE DRAWINGS

The above and other objects, features and advantages of the present invention will become more apparent from the following description of the presently preferred exemplary embodiment of the invention taken in conjunction with the accompanying drawings, in which.

DESCRIPTION OF THE PREFERRED EMBODIMENT

First Embodiment

Figure 1A:
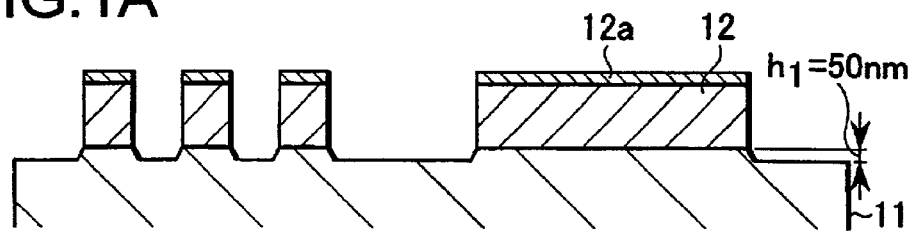
FIGS. 1A–1C are cross-sectional views illustrating steps of semiconductor device production method in accordance with a first embodiment of the present invention.
Figure 1B:
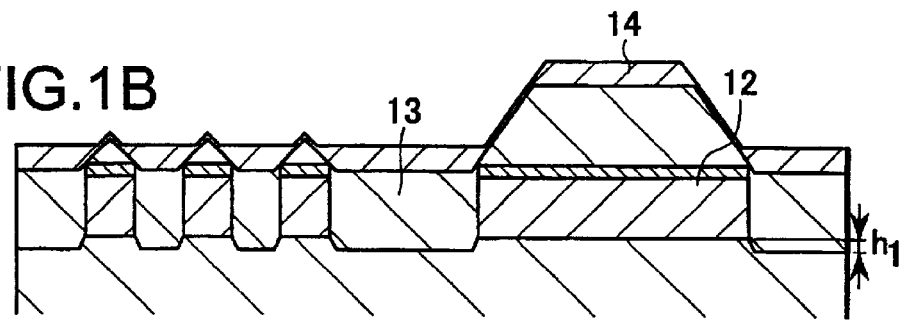
Figure 1C:
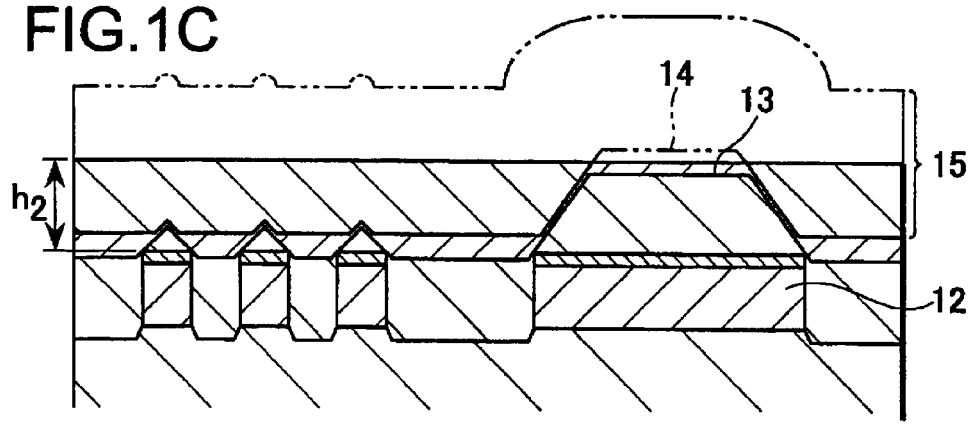

FIGS. 1A–1C are cross-sectional views illustrating steps of semiconductor device production method in accordance with a first embodiment of the present invention. The first embodiment of a production method will now be explained with reference to these figures.

First, as shown in FIG. 1A, metal wiring 12 (here aluminum wiring) is formed on a substrate 11. The substrate 11 may be a semiconductor substrate which surface is covered with silicon oxide. The semiconductor substrate may comprise, for example, single crystal silicon. The aluminum wiring 12 is formed, for example, as high as 600 nm including a reflection preventing film 12a formed at the upper portion thereby creating a step structure on the substrate 11. An amount hi of film thinning at the base (silicon oxide film) during etching step in the forming process of the aluminum wiring 12 is about 50 nm.

Next, as shown in FIG. 1B, a fluorine-doped oxide film (FSG layer) 13 is formed on the substrate 11 as a gap-filling insulation film for filling up gaps between the aluminum wiring 12 utilizing a high density plasma (HDP) CVD apparatus of an inductively coupled plasma (ICP) type. For example, a 600 nm thickness of the FSG layer 13 is formed while considering the film thinning (h1=50 nm) of the base of the aluminum wiring 12.

The following is an example of a film forming condition for the FSG layer 13:

| | |
|---|---|
| Film forming temperature: | 380° C. |
| Film forming ambient pressure: | 0.67 Pa |
| ICP power: | 4.2 kW |
| Bias RF power: | 2.2 kW |
| Film forming gas and flow rate: | Argon(Ar) = 65(cm³/min) |
| | Oxygen(O₂) = 110(cm³/min) |
| | Silane(SiH₄) = 30(cm³/min) |
| | Silane tetrafluoride (SiF₄) = 35(cm³/min) |

Subsequently, a silicon oxide layer (so-called non-doped silicate glass: NSG) 14 is formed right after the formation of the FSG layer 13. The NSG layer 14 is formed in-situ in the same chamber wherein the FSG layer 13 was formed while the forming temperature of the NSG layer 14 being set at higher than that of the FSG layer 13. At the same time, the forming temperature of the NSG layer 14 is set to a temperature equal or less than 450° C. under which a stress migration of the aluminum wiring 12 can be prevented. A film thickness of the NSG layer 14 is set to a thickness which can be formed in equal or less than 30 seconds with consideration of a turn-around-time (TAT) and the prevention of the stress migration of the aluminum wiring 12. For example, the film thickness is set to 200 nm. The following film forming condition of the NSG layer 14 may be set so as to obtain the NSG layer having more Si—H bonds for a higher resistance to water permeability, and to have a better planarity in the film thickness of the FSG layer and the NSG layer formed on the aluminum wiring 12 by optimizing a ratio of a film forming speed of the NSG layer 14 and a sputtering speed.

The following is an example of a film forming condition for the NSG layer 14:

| | |
|---|---|
| Film forming temperature: | 430° C. |
| Film forming ambient pressure: | 0.93 Pa |
| ICP power: | 4.5 kW |
| Bias RF power: | 3.0 kW |
| Film forming gas and flow rate: | Ar = 130(cm³/min) |
| | $O_2$ = 190(cm³/min) |
| | $SiH_4$ = 110(cm³/min) |

Next, as shown in FIG. 1C, an additional silicon oxide layer 15 (so-called P-TEOS layer) is formed on the NSG layer to 1550 nm film thickness by a plasma CVD method utilizing TEOS gas.

The P-TEOS layer 15 is then polished with the CMP process from its surface side. Polishing film thickness is determined so as that the polishing does not reach the FSG layer 13 on any part of a surface of the substrate 1. The polishing film thickness is determined based on fabrication conditions of the aluminum wiring 12, film thickness of the FSG layer 13, the NSG layer 14 and the P-TEOS layer 15, and least remaining film thickness h2 after the CMP process. Here, the least remaining film thickness is defined as a remaining film thickness of the insulation film on a part of the aluminum wiring 12, in which the density is the lowest and the polishing speed is high. The least remaining film thickness is equal to a sum of remaining film thickness of the FSG layer 13, the NSG layer 14 and the P-TEOS layer 15. In this example, h2 is equal to 675 nm.

In this example, the polishing film thickness during the CMP process is set to about 1000 nm so as that the CMP process is stopped at the NSG layer 14 at where the FSG layer 13 is peaked.

Accordingly, the interlayer insulating film having a planar surface is fabricated wherein the interlayer insulating film comprises the NSG layer and the P-TEOS layer 15 on the FSG layer 13. Subsequently, connecting holes are formed in the interlayer insulating film, and plugs connecting to the aluminum wiring 12 are formed. Finally, a semiconductor device is completed by forming an upper layer wiring connecting to these plugs.

Figure 2:
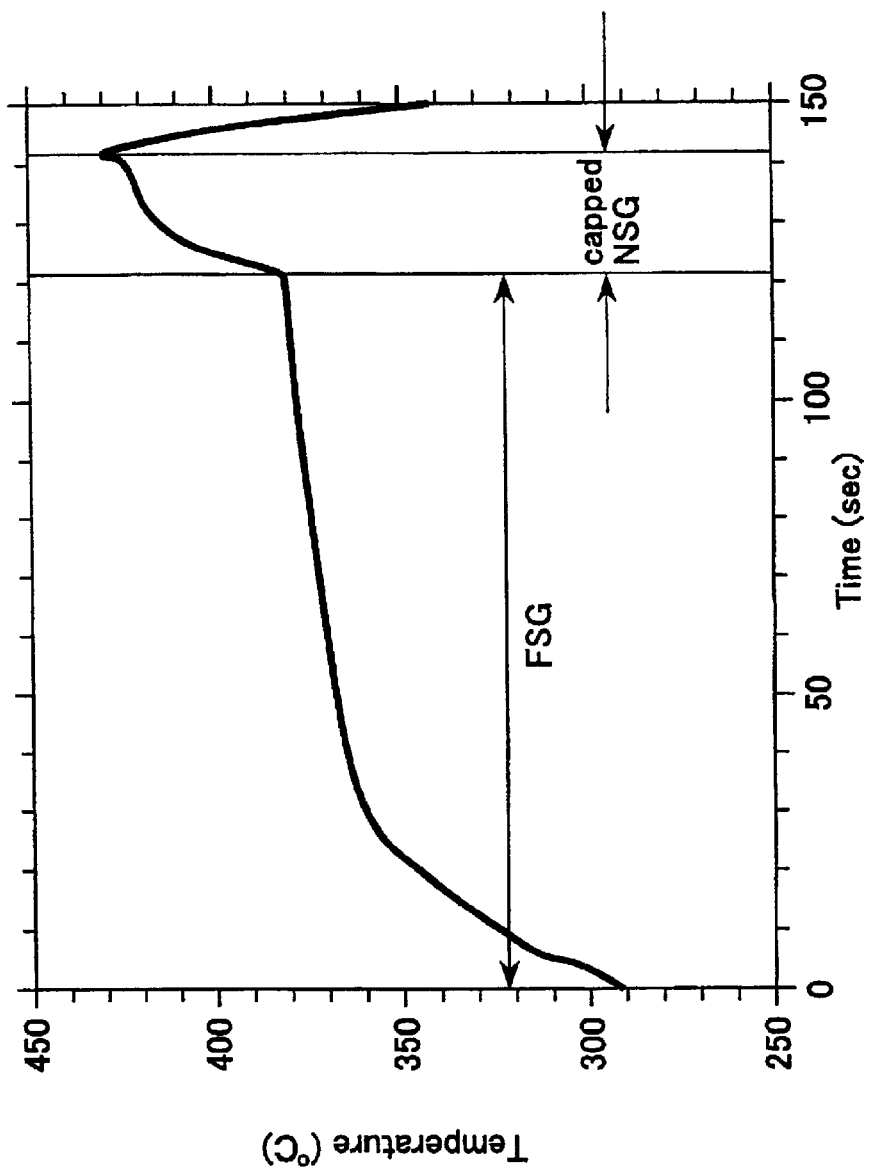
FIG. 2 is a graph showing a temperature profile during continuous in-situ film formation of FSG layer and NSG layer in the same chamber.

According to the above-cited production method, the free species incorporated into the FSG layer 13 during the formation of the FSG layer 13 may be desorbed by forming the NSG layer 14 at a temperature higher than the film forming temperature of the FSG layer 13. FIG. 2 shows a temperature profile during the in-situ continuous film formation of the FSG layer 13 and the NSG layer 14 in the same chamber. As indicated by the temperature profile, the temperature condition for the formation of the NSG layer 14 is set higher than that of the FSG layer 13. Accordingly, the free species in the FSG layer 13 may be desorbed during the formation of the NSG layer 14.

Figure 3A:
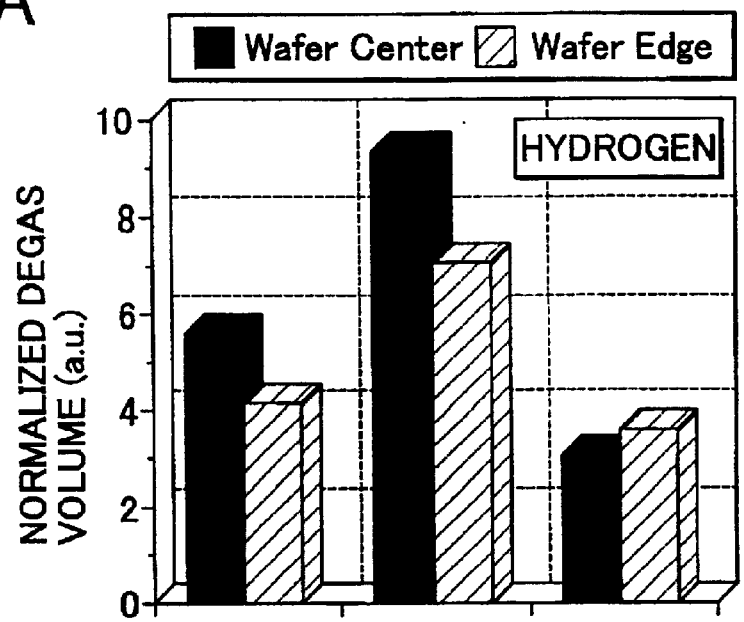
FIGS. 3A–3B are graphs showing degas volume of the free species with a temperature increase.
Figure 3B:
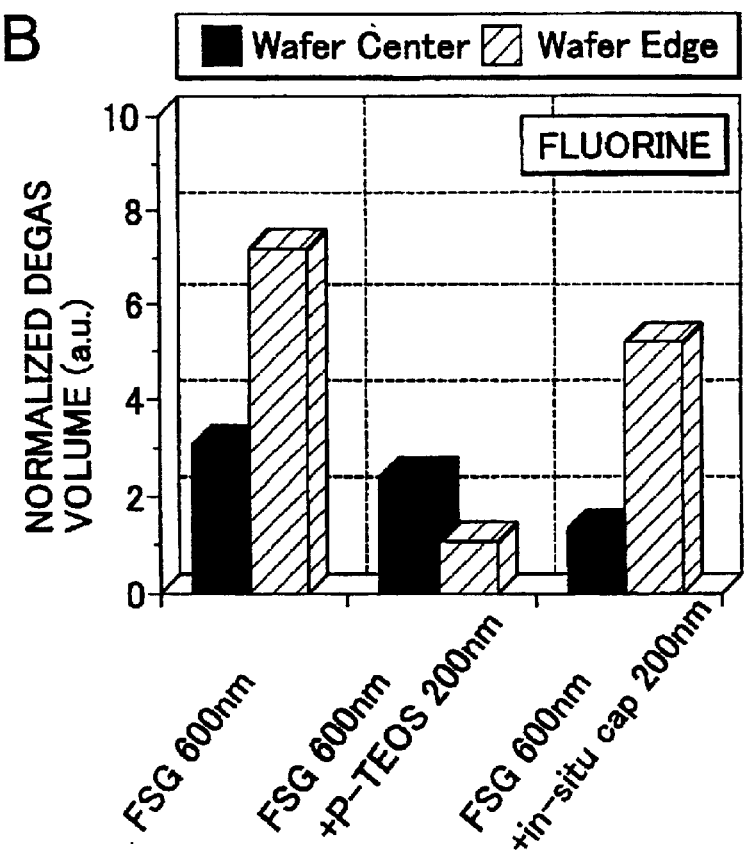

FIGS. 3A–3B show a degas volume of the free species (hydrogen and fluorine) from each layered film at an increased temperature. As shown in the figure, the degas volume from the multiple layered film comprising the FSG layer and the NSG layer formed in-situ thereon is less than the degas volume from the FSG single layer film (FSG 600 nm) both at wafer center and wafer edge. Accordingly, in the firs embodiment of production method, it is clear that the desorption of the free species from the FSG layer is advanced, and that an increased temperature desorption property for the free species from the FSG layer is promoted in comparison with the FSG single film layer.

Furthermore, resistance to moisture absorption of the FSG layer 13 may be promoted since the free species in the FSG layer 13 is desorbed during the formation of the NSG layer 14.

Furthermore, it is not required to take-out/place-in the substrate 11 from/to a process chamber as long as the forming conditions of each layer are modified accordingly since the FSG layer 13 and the NSG layer 14 are formed at the same chamber. Accordingly, the interlayer insulating film including the FSG layer 13 with a higher film quality and a less free species content may be formed without increasing a number of the production process steps. For example, it is also possible to prevent flaking-off of wiring formed on such interlayer insulating film.

Figure 11:
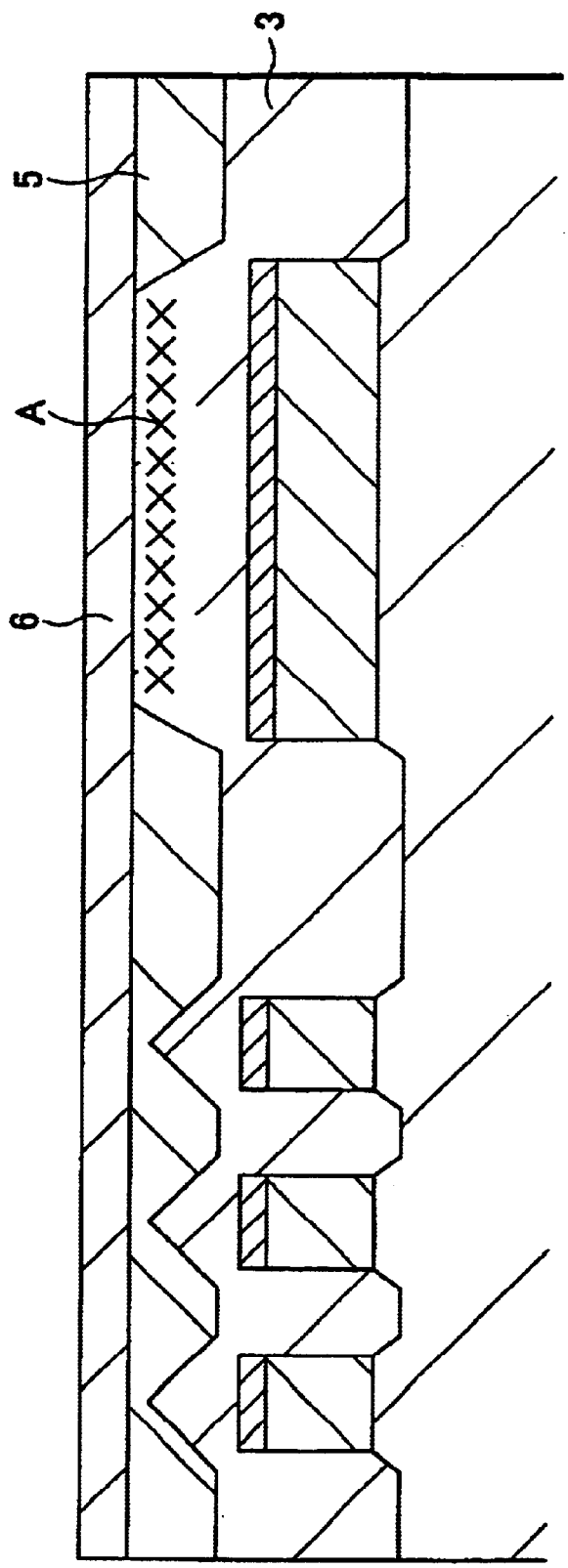
FIG. 11 is a cross-sectional view (part 3) illustrating related art.

In the present embodiment, the film forming conditions are determined so as not to expose the FSG layer 13 during the CMP process applied on the P-TEOS layer 15 formed on the NSG layer 14. Accordingly, it is possible to prevent deterioration of the FSG layer 13 caused by film quality changes due to the CMP process, and to maintain a preferable condition set at a time of the film formation of the FSG layer 13. Furthermore, the present embodiment enables not only to decrease a number of the production process steps in comparison with that of the related art shown in FIG. 11 but also to promote reliability in the film quality of the FSG layer. Namely, the film quality of the FSG layer is not reliable in the related art described with FIG. 11 since there may be some remainder of the deteriorated portion A, that was formed after sputtering the polished surface and was not removed completely. On the other hand, in the present embodiment, no deteriorated portion may be generated at the FSG layer 13 during the production process since the CMP process does not reach to the FSG layer 13.

Furthermore, moisture absorption at the FSG layer 13 may be prevented by forming the NSG layer 14, having a more Si—H bond to attain a higher resistance to moisture permeability, that can block the moisture penetration during the CMP process. Accordingly, the deterioration of the FSG layer 13 due to the moisture absorption may be surely prevented. Furthermore, a decrease in the wiring yield may be prevented by adjusting a ratio of the film forming speed of the NSG layer 14 and the sputtering speed so as to even out depth variations among the plugs connecting to the wiring 12.

Second Embodiment

Figure 4A:
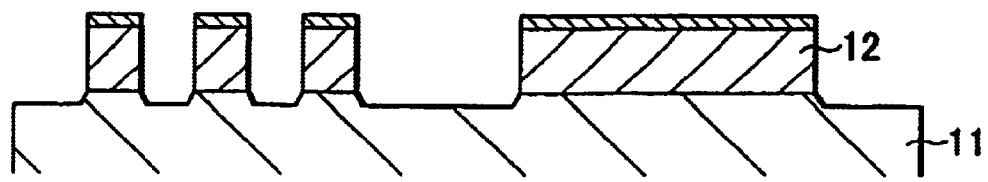
FIGS. 4A–4B are cross-sectional views illustrating steps of semiconductor device production method in accordance with a second embodiment of the present invention.
Figure 4B:
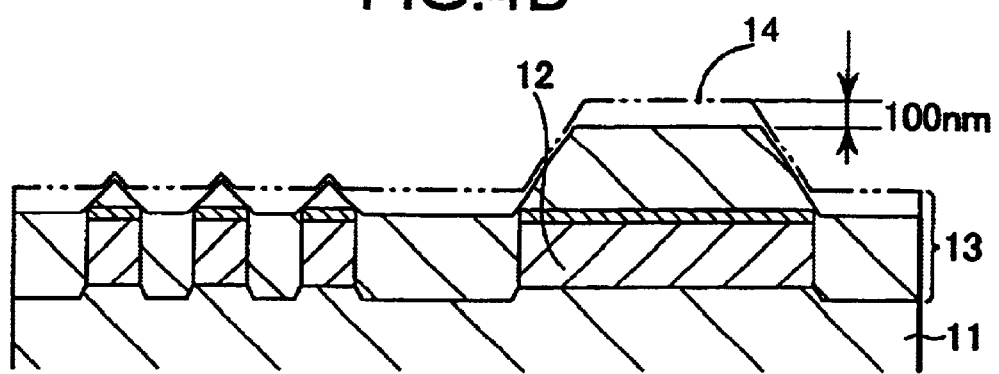

FIGS. 4A–4B are cross-sectional views illustrating steps of semiconductor device production method in accordance with a second embodiment of the present invention. The second embodiment of a production method will now be explained with reference to these figures.

First, as shown in FIG. 4A similar to the first embodiment, the aluminum wiring 12 as a metal wiring is formed on a substrate 11. The substrate 11 may be a semiconductor substrate which surface is covered with silicon oxide. The semiconductor substrate may comprise, for example, single crystal silicon.

Next, as shown in FIG. 4B similar to the first embodiment, the FSG layer 13 is formed on the substrate 11 for filling up gaps between the aluminum wiring 12 and covering it up. In this example, a 700 nm thickness of the FSG layer 13 is formed.

Subsequently, a surface layer of the FSG layer 13 is removed about 100 nm by sputtering after the formation of the FSG layer 13. The sputtering process is performed in-situ at the same chamber with the formation of the FSG layer 13.

The following is an example of a sputtering condition for the FSG layer 13:

| Film forming ambient pressure: | 0.67 Pa |
|---|---|
| ICP power: | 4.5 kW |
| Bias RF power: | 3.0 kW |
| Film forming gas and flow rate: | Ar = 130(cm$^3$/min) |
| | O$_2$ = 130(cm$^3$/min) |

Subsequently, in the similar way as that of the first embodiment, the P-TEOS layer is formed and then polished with the CMP process as much as the FSG layer 13 is not exposed. Accordingly, the interlayer insulating film having a planar surface may be fabricated wherein the interlayer insulating film comprises the NSG layer and the P-TEOS layer 15 on the FSG layer 13. Subsequently, connecting holes are formed in the interlayer insulating film, and plugs connecting to the aluminum wiring 12 are formed. Finally, a semiconductor device is completed by forming an upper layer wiring connecting to these plugs.

Figure 5:
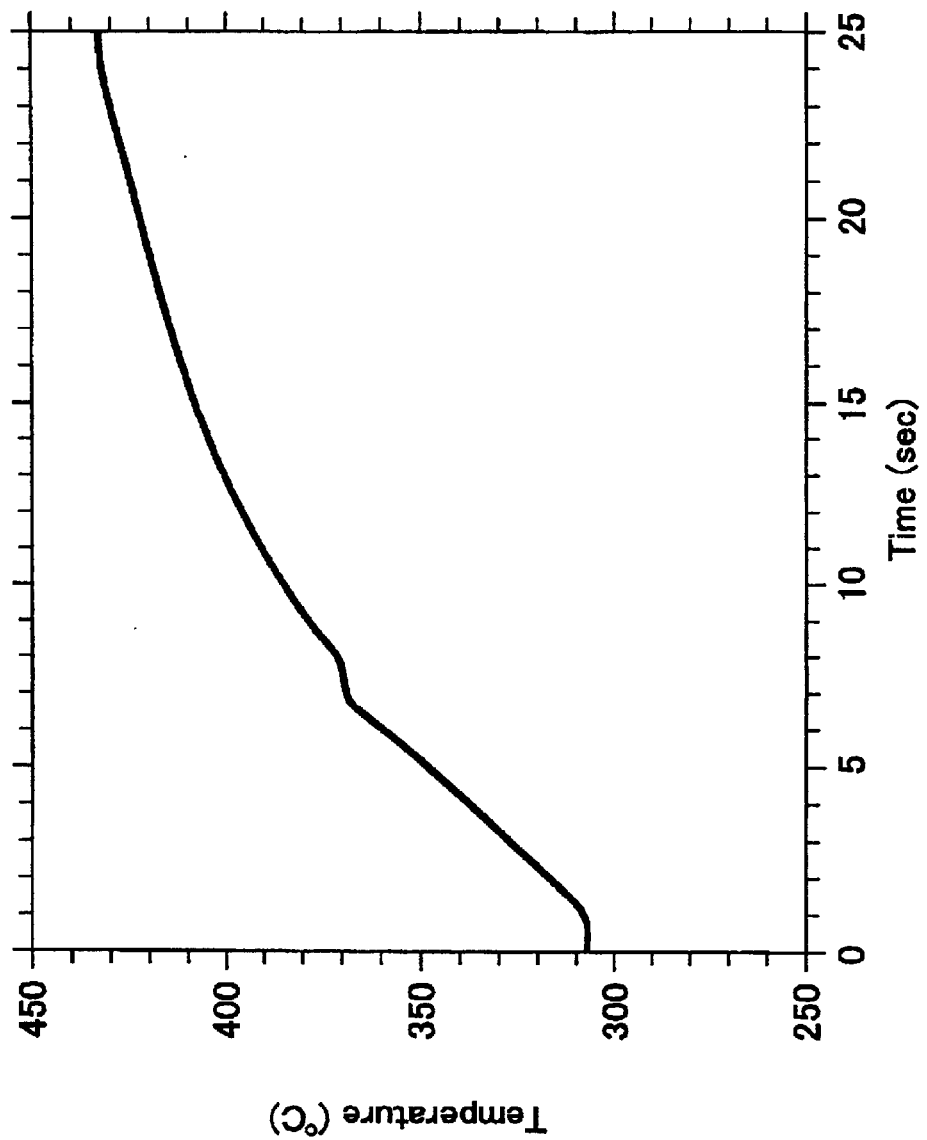
FIG. 5 is a graph showing a temperature profile during formation of FSG layer and subsequent in-situ sputtering of its surface layer performed in the same chamber.
Figure 6:
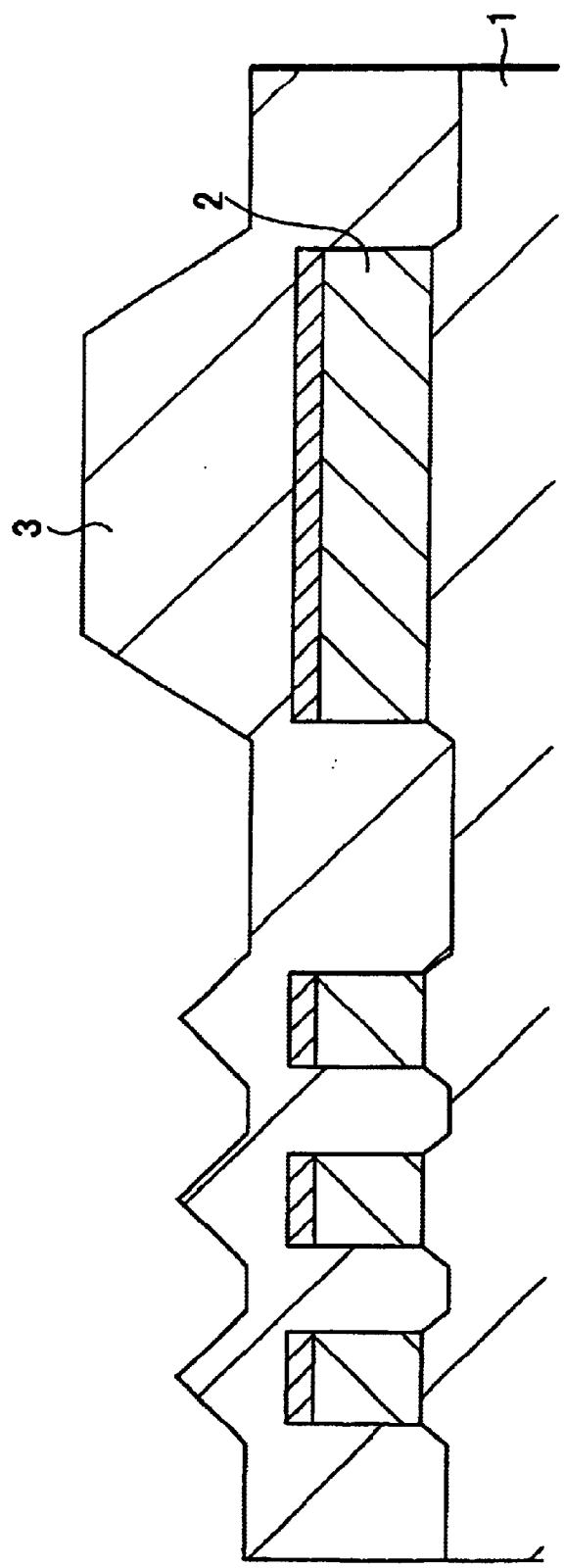
FIG. 6 is a cross-sectional view (part 1) illustrating related art.
Figure 7:
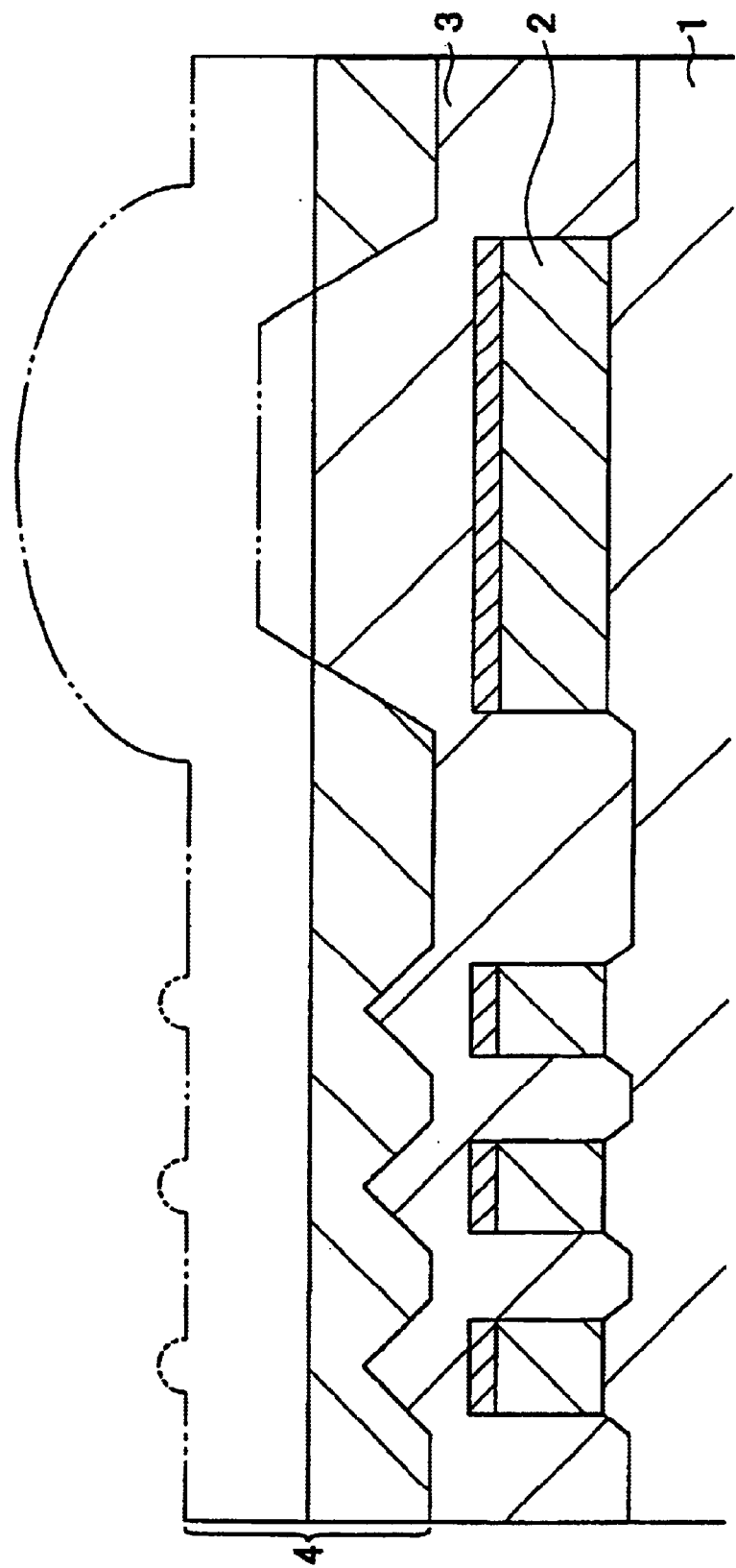
FIG. 7 is a cross-sectional view (part 2) illustrating related art.
Figure 8:
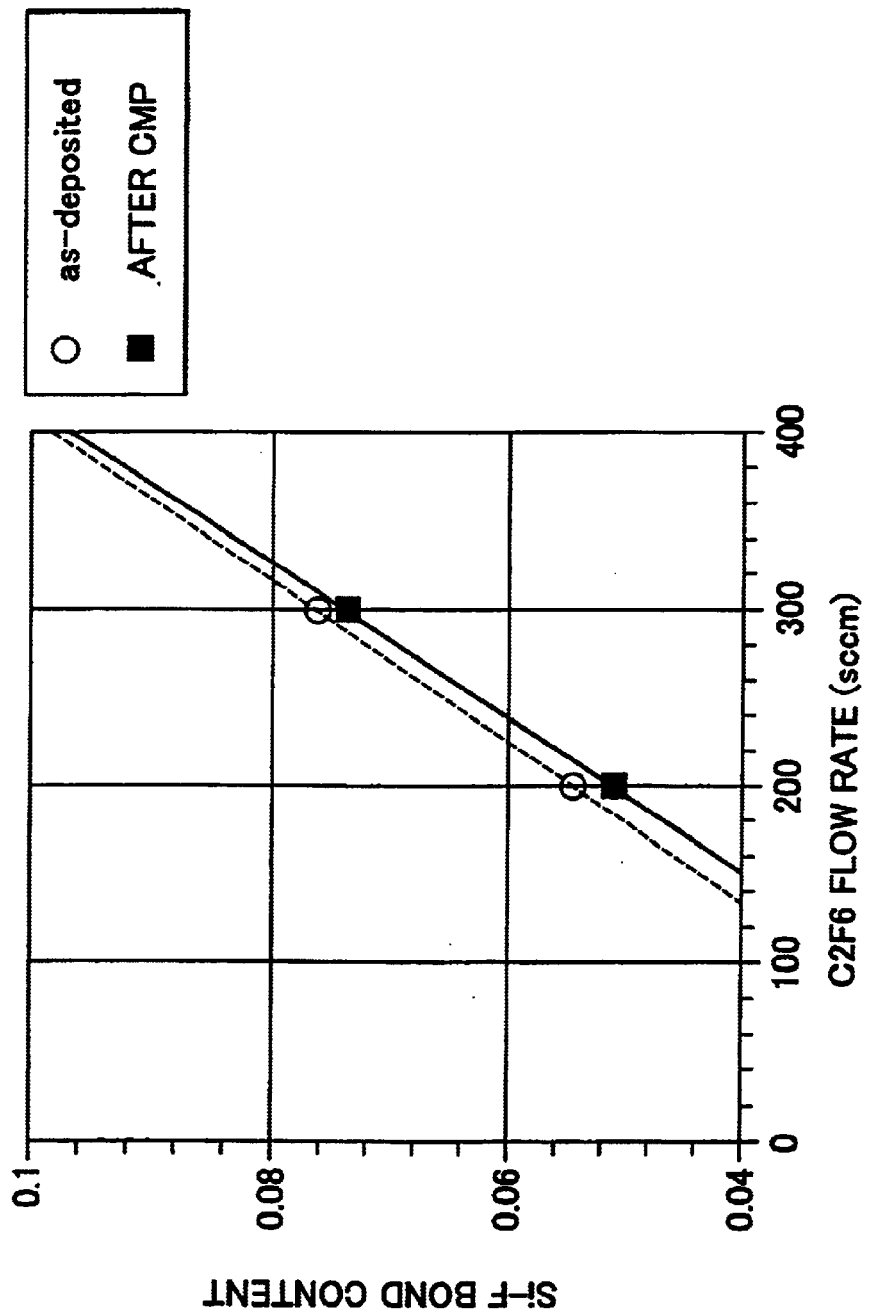
FIG. 8 is a graph showing Si—F bond content in FSG layer before and after of the CMP.
Figure 9:
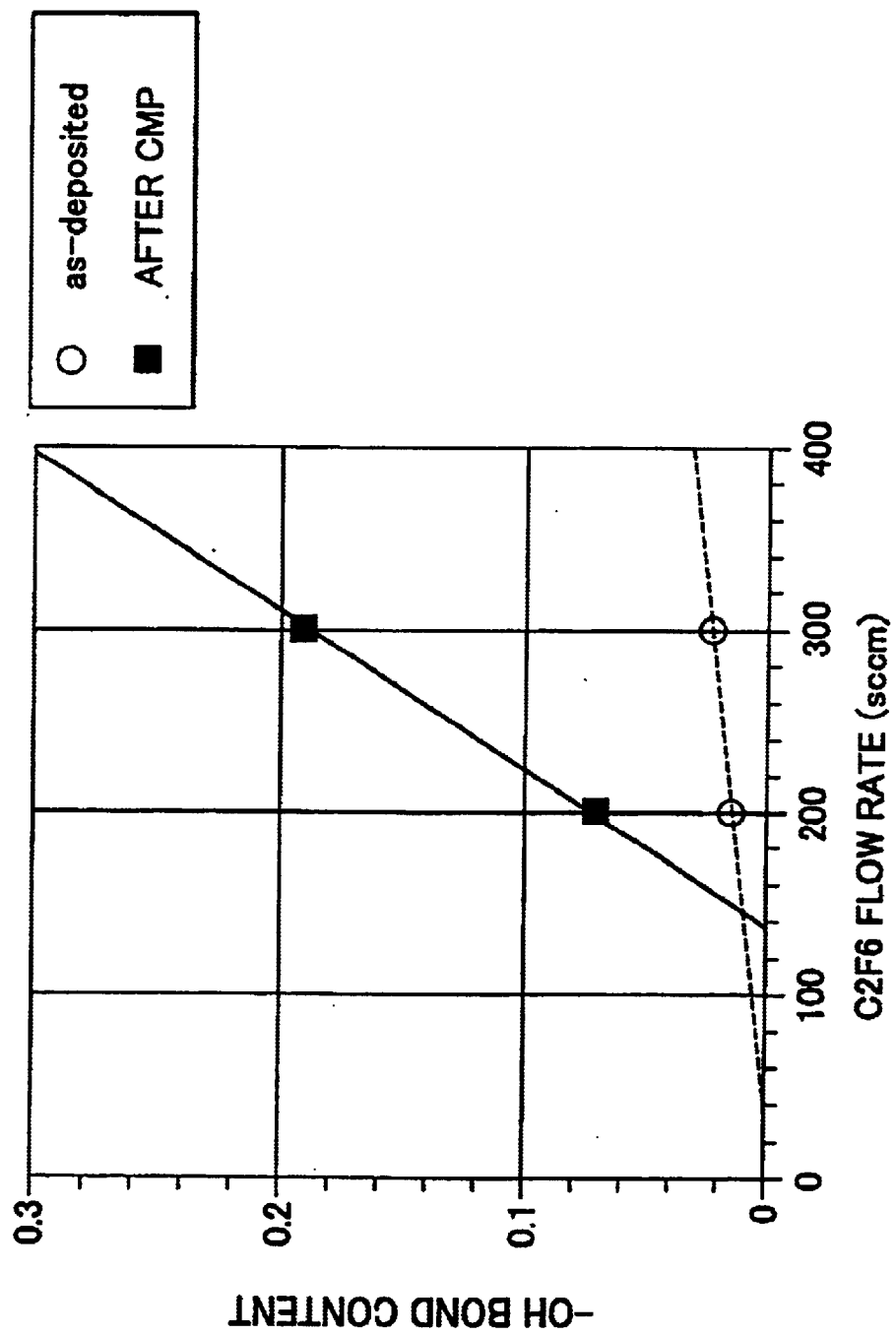
FIG. 9 is a graph showing hydroxyl group bond content in FSG layer before and after of the CMP.
Figure 10:
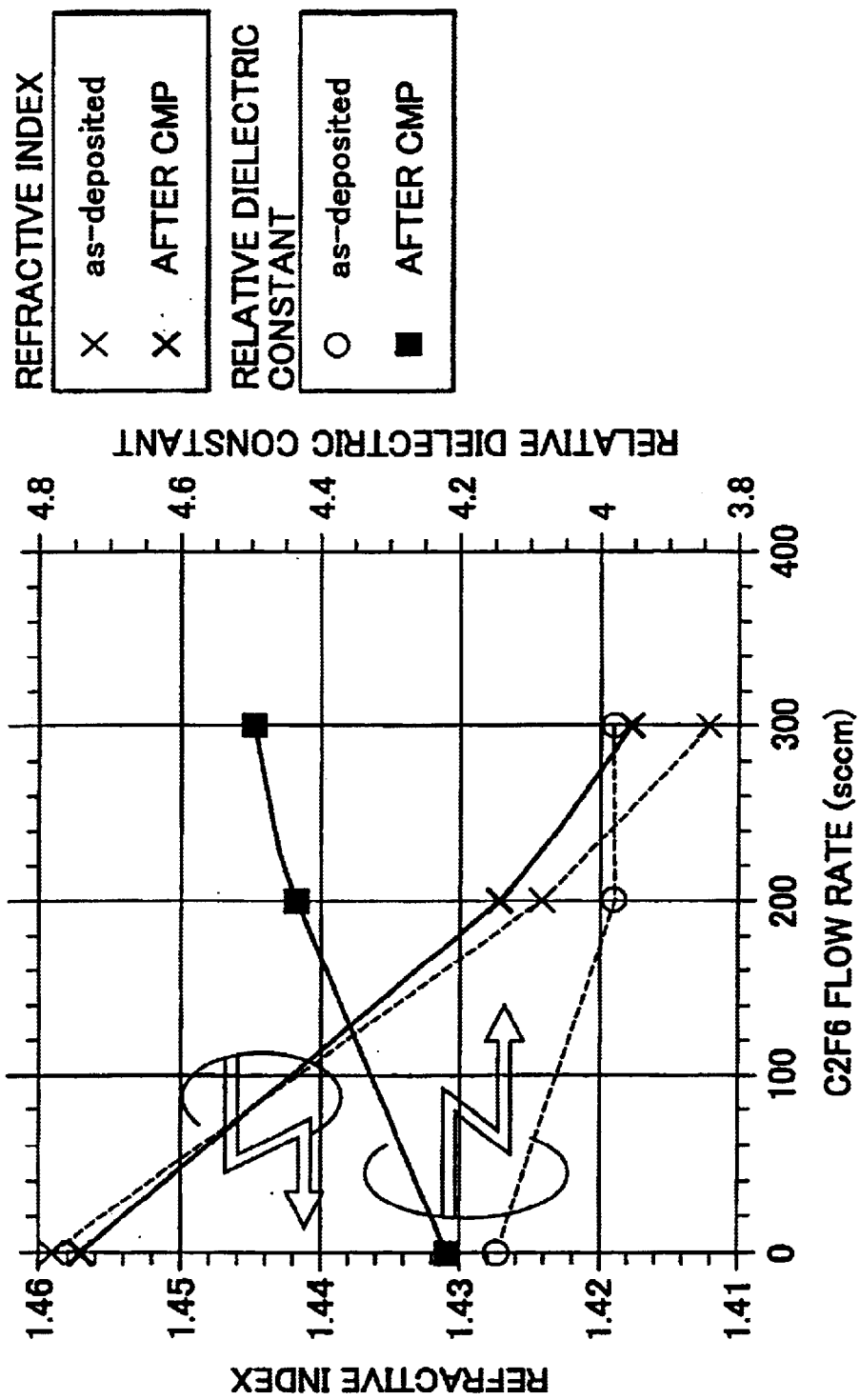
FIG. 10 is a graph showing refractive index and relative dielectric ratio of FSG layer before and after of the CMP.

According to the above-cited production method, a low temperature annealing effect due to plasma energy may act on the FSG layer 13 by sputtering the surface layer of the FSG layer 13. Accordingly, the free species incorporated into the FSG layer 13 during its formation may be desorbed from the FSG layer 13 during the sputtering process. FIG. 5 shows a temperature profile during the sputtering of a surface layer of the FSG layer 13. As indicated by the temperature profile, the temperature during the sputtering finally reaches to a value higher than the temperature for forming the FSG layer 13 (380° C.) thereby allowing the desorption of the free species from the FSG layer 13 during the sputtering.

Furthermore, it is not required to take-out/place-in the substrate from/to a process chamber as long as source gases and processing conditions are modified accordingly since the formation of the FSG layer 13 and the sputtering are continuously carried out in-situ at the same chamber. Accordingly, the interlayer insulating film including the FSG layer 13 with a higher film quality and a less free species content may be formed without increasing a number of the process steps. For example, it is also possible to prevent flaking-off of wiring formed on such interlayer insulating film.

In the present embodiment, similar to the first embodiment, the process conditions are determined so as not to expose the FSG layer 13 during the CMP process applied on the P-TEOS layer formed on the FSG layer 13. Accordingly, it is possible to maintain a preferable condition set at a time of the film formation of the FSG layer 13.

The above-cited embodiments are described for methods in which the CMP process is utilized for the planarization of the interlayer insulating film having FSG layer 13.

Alternatively, the planarization of the interlayer insulating film may be performed by etch-back process on the P-TEOS layer. Here, an amount of the etch-back is determined so as that the etch-back does not reach the FSG layer 13 in similar way as the CMP process when the planarization of the interlayer insulating film is performed with the etch-back process. Accordingly, changes of film quality of the FSG layer due to the etch-back process may be prevented.

According to the semiconductor device production methods of the present inventions, the free species may be desorbed from the FSG layer without taking-out/placing-in the substrate from/to the process chamber by forming the FSG layer, and the subsequent formation of the NSG layer or subsequent sputtering of a surface layer of the FSG layer, in the same chamber. Accordingly, it is possible to form the interlayer insulating film having the FSG layer, in which a film quality is maintained high and a dielectric constant is kept low without increasing a number of the process steps. Furthermore, according to the above described methods, it is possible to form the wiring on such interlayer insulating film while keeping a good adhesion property. Accordingly, the interlayer insulating film having the FSG layer may easily be applicable to the production process of the related art, and controlling of the capacitance increase due to the miniaturization of the device structure may be attained at a lower cost.

Although the invention has been described in its preferred form with a certain degree of particularity, obviously many changes, variations and combinations are possible therein. It is therefore to be understood that any modifications will be practiced otherwise than as specifically described herein without departing from the scope of the present invention.

What is claimed is:

1. A method for producing a semiconductor device including formation of an interlayer insulating film having a fluorine-doped silicon oxide layer over a substrate, the method comprising:

forming said fluorine-doped silicon oxide layer in a process chamber; and removing a surface layer of said fluorine-doped silicon oxide layer by sputtering in the same process chamber subsequent to the formation of said fluorine-doped silicon oxide layer and prior to formation of an insulating layer over the fluorine doped silicon oxide layer, and wherein the step of removing the surface layer is performed by sputtering such that the temperature during sputtering reaches a value higher than a temperature of forming the fluorine-doped silicon oxide layer.

2. The method for producing a semiconductor device according to claim 1, further comprising:

forming an insulation layer over a surface layer of said fluorine-doped silicon oxide layer after the sputtering; and planarizing said insulation layer with a chemical mechanical polishing process or a plasma etching process from a surface side of said insulation layer without exposing said fluorine-doped silicon oxide layer.

3. The method of producing a semiconductor device of claim 1, wherein the step of removing the surface layer is performed prior to any additional step of further processing the fluorine doped silicon oxide layer.

* * * * *